(12) United States Patent
Thøgersen et al.

(10) Patent No.: US 9,529,037 B2
(45) Date of Patent: Dec. 27, 2016

(54) METHOD FOR ESTIMATING THE END OF LIFETIME FOR A POWER SEMICONDUCTOR DEVICE

(75) Inventors: Paul Bach Thøgersen, Aalborg Øst (DK); Bjørn Rannestad, Aalborg (DK)

(73) Assignee: KK Wind Solutions A/S, Ikast (DK)

( * ) Notice: Subject to any disclaimer, the term of this patent is extended or adjusted under 35 U.S.C. 154(b) by 413 days.

(21) Appl. No.: 14/125,199

(22) PCT Filed: Jun. 21, 2012

(86) PCT No.: PCT/EP2012/061949
§ 371 (c)(1),
(2), (4) Date: Dec. 10, 2013

(87) PCT Pub. No.: WO2012/175603
PCT Pub. Date: Dec. 27, 2012

(65) Prior Publication Data
US 2014/0125366 A1    May 8, 2014

(30) Foreign Application Priority Data

Jun. 21, 2011  (EP) .................................... 11170704

(51) Int. Cl.
*G01R 31/26*    (2014.01)

(52) U.S. Cl.
CPC ....... *G01R 31/2642* (2013.01); *G01R 31/2608* (2013.01)

(58) Field of Classification Search
CPC ............. G01R 31/2642; G01R 31/261; G01R 31/2608
USPC .......................... 324/750.03, 750.05, 750.08
See application file for complete search history.

(56) References Cited

U.S. PATENT DOCUMENTS

| 5,650,336 A | 7/1997 | Eriguchi et al. |
| 5,877,419 A * | 3/1999 | Farokhzad ......... G01R 31/2608 324/762.08 |
| 7,268,575 B1 | 9/2007 | Chen et al. |
| 7,279,954 B2 * | 10/2007 | Throngnumchai ...... G01K 7/42 327/138 |
| 2007/0121354 A1 * | 5/2007 | Jones .................. H02M 5/4585 363/47 |

(Continued)

FOREIGN PATENT DOCUMENTS

| CN | 101452044 A | 6/2009 | |
| DE | WO 2013075733 A1 * | 5/2013 | ......... G01R 31/2642 |
| DE | 102013211038 B3 * | 10/2014 | ......... G01R 31/2628 |

OTHER PUBLICATIONS

International Search Report and Written Opinion for International Application No. PCT/EP2012/061949, dated Oct. 2, 2012.

*Primary Examiner* — Christ Mahoney
(74) *Attorney, Agent, or Firm* — Dinsmore & Shohl LLP; Weston Gould

(57) ABSTRACT

The invention regards an method for estimating the end of lifetime for a power semiconductor device, such as an IGBT power module, comprising the steps of; establishing the temperature of the power semiconductor device, determining the voltage drop over the power semiconductor device for at least one predetermined current where the current is applied when the power semiconductor device is not in operation, wherein the end of lifetime is established dependent on the change in a plurality of determined voltage drops.

21 Claims, 4 Drawing Sheets

(56) References Cited

U.S. PATENT DOCUMENTS

| | | | |
|---|---|---|---|
| 2010/0327872 A1 | 12/2010 | Chen et al. | |
| 2011/0248194 A1* | 10/2011 | Svajda | G01S 3/7803 250/552 |
| 2014/0212289 A1* | 7/2014 | Thogersen | G01K 7/01 416/146 R |
| 2014/0312817 A1* | 10/2014 | Lipp | H03K 17/166 318/400.27 |

* cited by examiner

METHOD FOR ESTIMATING THE END OF LIFETIME FOR A POWER SEMICONDUCTOR DEVICE

CROSS-REFERENCE TO RELATED APPLICATIONS

This application is the U.S. National Phase of PCT/EP2012/061949 filed Jun. 21, 2012, which claims priority of European Patent Application 11170704.8 filed Jun. 21, 2011, and U.S. Provisional Patent Application 61/534,565 filed Sep. 14, 2011.

FIELD OF INVENTION

The invention relates to a method and an apparatus for estimating the end of lifetime for a power semiconductor device and a wind turbine using the method or comprising the apparatus.

BACKGROUND OF THE INVENTION

Power semiconductor devices, also known as power devices, are known in the art and used as switches or rectifiers in power electronic circuits. In wind turbines power semiconductor devices can be used to connect the generator with the grid. In some wind turbines power converters (comprising semiconductor devices) controls the power flow to the grid.

It is known in the art that power semiconductor device wear out due to mechanical and thermal stress, therefore it is desirable to be able to estimate the end of lifetime or remaining lifetime for a power semiconductor device. This makes it possible, for example, to plan the replacement of the devices before a critical failure.

U.S. Pat. No. 5,877,419 discloses a method for estimating the service life of a power semiconductor component, comprising the steps of subjecting the component to a periodic load change, measuring an electrical parameter P of the component that serves as an indicator for reliability or durability against the number N of load changes, calculating a derivative dP/dN of the electrical parameter P according to the number N of load changes; and comparing the derivative dP/dN with a target value representing a determined service life.

U.S. Pat. No. 5,650,336 disclose a method for predicting the lifetime of a semiconductor device, in which the time from application of an electric stress, including a current and a voltage, onto an element of the semiconductor device until said element becomes unusable, is measured and thereafter the lifetime of the semiconductor device is predicted, with a second electric stress applied, while utilizing a test, in which a first electric stress is applied. This method is destructive and renders the semiconductor device usable. Further, the method applies stress to an element of the semiconductor, such as a gate oxide film, which makes it impossible to predict the end of lifetime for the semiconductor device.

SUMMARY OF THE INVENTION

Considering the prior art described above, it is an object of the present invention to estimate the end of lifetime for a power semiconductor device, such as an IGBT power module, in a reliable manner and well ahead of a failure in order to take the necessary action to prevent down time.

The object can be achieved by means of a method, comprising the steps of; establishing the temperature of the power semiconductor device, determining the voltage drop over the power semiconductor device for at least one predetermined current where the current is applied when the power semiconductor device is not in operation, wherein the end of lifetime is established dependent on the change in a plurality of determined voltage drops.

Thus, it is possible, in greater detail and more precisely, to estimate the end of lifetime of a power semiconductor device. As cost of down time for an apparatus using a power semiconductor device can be expensive the knowledge of the end of lifetime can be used to plan the change of the power device before actual failure. Estimation of the end of lifetime can also be interpreted as a measure for the wear out of the power semiconductor device.

In case of a wind turbine the knowledge of the end of lifetime for a power device can prevent loss of production as the power device can be replaced and/or be de-rated in order to keep the power device in production until change of the device can be made. Further, it is noted that the power semiconductor device can be used in between the voltage drops are determined and after the end of lifetime is estimated. It is an advantage of the present invention that lifetime can be estimated with only a short non-operation period of the power semiconductor device. In other words the method is non-destructive for the power semiconductor device.

Power semiconductor device can be understood as a part of a power converter, such as a power inverter or power stack. The power semiconductor device can be build up of diodes, such as power silicon or silicon carbide diodes, or switches, such as MOSFET's, IGBT's, GTO's, IGCT's, thyristors or silicon carbide switches.

A power semiconductor device of a power converter are loaded differently during the lifetime of a power semiconductor device and it is impossible to produce all power semiconductors of one type, completely identical, which results in different electrical resistance over the power semiconductor device. Among other things, this has made it impossible to determine the end of lifetime for a power semiconductor device in the past. However, by use of the present invention this is now possible.

The expression "not in operation" should be understood in such a way that the power semiconductor device is not performing the task that it is intended for in the system wherein it is installed. A power semiconductor device can be in operation or not in operation, when in operation the power semiconductor device converts power in the apparatus where it is installed and when not in operation the semiconductor does not convert power in the apparatus where it is installed. For example, a power semiconductor device in a power inverter, is not in operation when it is not actively conducting current to be converted. Alternatively one of the following words can be used, not in action, off-line or non production mode.

In a power device there can be one or more thermal stacks with power semiconductor material (also known as a power semiconductor chip or simply chip) thermally connected to a baseplate, the connection can be secured by isolation and solder. Further structural possibilities for thermal stacks in a power semiconductor device are known in the art, for example the thermal stack can be made without a baseplate. The baseplate can be made from copper or AlSiC and connected to a heat sink, such as a liquid cooling system. As there is a temperature gradient in the thermal stack when the power device is in operation, the temperature of the chip is not identical to the temperature of the liquid or the base plate. Therefore it is an advantage to perform the voltage measuring when the temperature is known and when the device is not in operation. This is because the temperature gradient in the thermal stack is minimal when the power semiconductor device is not in operation as no heat is produced in the silicon chip.

In an embodiment, the end of lifetime is established by comparing the plurality of determined voltage drops with a reference data set of voltage drops. Preferably, the reference data set is established via accelerated tests. This ensures a simple and systematic way of evaluating the end of lifetime. Alternatively, actual measurements from a similar power semiconductor device or theoretical calculated can be used as reference data. It is to be understood that every type and specific construction of a power device and converter design could require its specific reference data set.

Advantageously, the reference data set can be substituted with a new updated reference data set at any time. As the condition and the gradual wear out of the power semiconductor device changes over time it is an advantage to be able to update the reference data set at any time.

In an embodiment, estimated end of lifetime is used to change a derating factor for the power semiconductor device. This is a way of ensuring a prolonged lifetime of the power device. By derating factor is meant that the voltage, current or switching frequency over the power device is diminished by a factor compared to the rated maximum for the device.

Preferably, the temperature is established by determining the temperature of a power semiconductor chip comprised in the power semiconductor device. This temperature is also known as the junction temperature of the chip. This can be done by measuring the temperature directly on the power semiconductor chip via a temperature sensor or indirectly by exploitating the dependence between the voltage drop and the temperature of the chip.

Preferably, the temperature is established by heating the power semiconductor device to a predetermined temperature, preferably by use of a liquid in thermodynamic contact with the power semiconductor device. This can be done by heating the liquid to any desired temperature, such as 30° C., 40° C., 50° C., 60° C., 70° C., 80° C., which will ensure that the power semiconductor device has the desired temperature when not in operation.

In an embodiment, the temperature is established when the power semiconductor device is not in operation. This requires additional time wherein the power semiconductor device is not in operation. On the other hand it makes it possible to have a measurement cycle entirely devoted to determine the voltage drop that can be initiated when the device is not in operation and secure that the method for estimating the end of lifetime does not influence the operation of the device.

Preferably, the power semiconductor device has not been in operation for at least five times the thermal time constant of the thermal stack. This ensures that gradient temperature in the power semiconductor device and/or the stack is minimal.

Advantageously, the current is applied for less time than 10% of the thermal time constant for a silicon chip comprised in the power semiconductor device. When determining the voltage drop over the power semiconductor device the device has to be activated and current will go through it. This heats the power device. In order to ensure that the thermal energy does not rise to a level where it will influence significantly on the determining of the voltage drop current can be applied for a short time only. The short time can be less time than 10% of the thermal time constant for the silicon chip, for example, less than 1 millisecond.

In an embodiment, determining the voltage drop is established as a function of the lifetime consumption for the power semiconductor device. Activation of the power device is normally not evenly distributed over time. Therefore, it can be an advantage, when evaluating the wear out of a power device, to use the lifetime consumption that the device has performed instead of the actual time. Lifetime consumption can also be understood as the number of equivalent cycles, which is advantageously when comparison with accelerated tests are performed.

In a further aspect the present invention regards an apparatus for estimating the end of lifetime for a power semiconductor device, such as an IGBT power module, in a power conversion apparatus, comprising; means for establishing the temperature of the power semiconductor device, means for determining the voltage drop over the power semiconductor device for at least one predetermined current where the current is applied when the power semiconductor device is not in operation, means for establishing the end of lifetime based on the change of a plurality of determined voltage drops.

Thus, the apparatus enables greater detail and more precisely estimate the end of lifetime of a power semiconductor device.

The means for establishing the temperature can be an active device where the temperature is determined and then the power semiconductor device is either cooled or heated to a desired temperature. It can also be a passive device where the temperature is determined by a temperature sensor or by a voltage drop measurement where the dependence between the voltage drop and the temperature of the chip is exploited.

The means for determining the voltage drop can be an analog-to-digital converter (ADC). The means for establishing the end of lifetime can be a unit that can calculate and/or compare data, such as a micro processor.

It is to be understood that the apparatus can be modified in such a way that it can perform any of the methods described in the claims.

In an embodiment, the means for establish end of lifetime, compare the plurality of determined voltage drops with a reference data set of voltage drops. Preferably the reference data set is established via accelerated tests. This ensures a simple and systematic way of evaluating the end of lifetime. It is to be understood that every type and specific construction of a power device requires its specific reference data set. It is also an advantage to use similar measuring tools and similar setup for the accelerated tests as the method for estimating the end of lifetime for a power semiconductor device as this eliminates some of the systematic errors or other errors.

In an embodiment the apparatus further comprises at least one gate drive for the power semiconductor device, wherein the means to measure the voltage is integrated in the gate drive. As a power module will most likely need a gate drive, such a gate drive can comprise; a gate controlling circuit, a switch mode power supply, a interface to control system through a galvanic isolated barrier or level shift, a shoot through and/or overcurrent protection, a logic to prevent shoot through and minimum dead time generation. To lower the cost of the measuring circuit it can use some of the components of the gate drive, such as the switch mode power supply and/or parts of interface to control system. Further the voltage measurement can be used as a de-saturation protection circuit and protect the power module against overcurrent.

In an embodiment, the apparatus further comprises means for substituting the reference data set with a new updated reference data. These means could be a micro processor, or incorporated into another control device already comprised in the device.

In an embodiment, the means for establishing the temperature heats the power semiconductor device to a predetermined temperature, preferably by use of a liquid in thermodynamic contact with the power semiconductor device. This ensures a simple way of establishing the temperature of the power semiconductor device.

In an even further aspect the present invention regards a wind turbine comprising a power semiconductor device and an apparatus as described above. Using the device or method described above to estimate the end of lifetime for power semiconductors devices in a wind turbine has several advantages, as mentioned above.

Lost production means lost income for the turbine owner, thus there is a clear economical incentive to ensure that the turbine is in production at all times. On the other hand power modules are expensive and should not be changed until close to their end of lifetime. The above described apparatus and method can ensure that cost are minimised while the turbine is kept in production. Hence, at least the following situations can be controlled, when end of lifetime can be established: Change of the power device can be planed ahead of the actual malfunction of the device, this is especially important for off-shore wind turbines as they are more difficult to reach. When the end of lifetime approaches the power can be de-rated which prolongs the lifetime of the power device, and power production of the wind turbine can continue until the power device can be replaced. Alternatively or in combination with a de-rating the power flow distribution for a plurality of power devices can be altered so that power devices closest to end of lifetime carry least current or is taken out of operation.

In an embodiment, the wind turbine further comprises a liquid based system in thermodynamic contact with the power semiconductor device, wherein the liquid system comprises means for controlling the temperature of the liquid, preferably further comprising a heater suitable to heat the liquid to the desired temperature. The heater can be an electrical heater. In this embodiment the conventionally used cooling liquid can be used to heat the power device and in this way establish the desired temperature of the power device.

Advantageously, the wind turbine further comprises a wind turbine control system operationally connected to a power converter comprising the power semiconductor device and that the liquid system is operationally connected to the power converter. Preferably, the wind turbine control system is operationally connected to the liquid system. Using the already installed wind turbine control system to perform the steps for estimating the end of lifetime lowers the cost for the incorporation of the estimation of the end of lifetime compared to installing a new device in the wind turbine.

DESCRIPTION OF THE DRAWINGS

The invention will in the following be described in greater detail with reference to the accompanying drawings.

DETAILED DESCRIPTION OF THE INVENTION

The invention relates to estimation of remaining or end of lifetime for power semiconductor devices being part of power converters, and for example being build up of active switches and/or diodes, for example: IGBT's, Thyristors, GTO's, MOSFET's, IGCT's, silicon carbide switches, power silicon diodes or power silicon carbide diodes. The estimation method is based on the establishment (e.g. measurement) of the voltage drop across the power device, when it is conducting a current. These voltage measurements are then stored and the end of lifetime is estimated on the basis of changes in the voltage drop as a function of the lifetime consumption by the power device.

Figure 1:
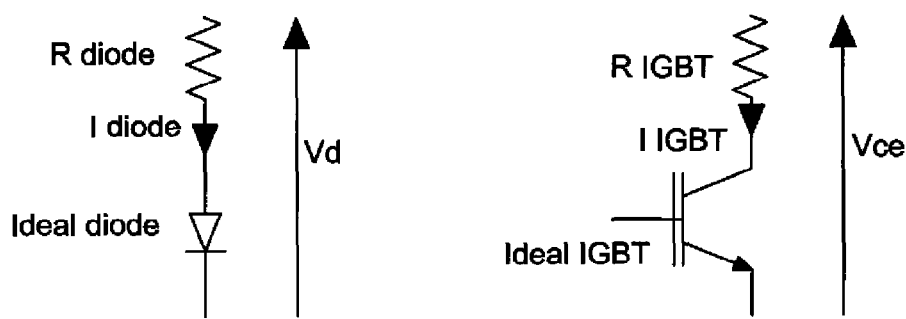
FIG. 1 a schematic view of a diode and a switch
FIG. 2 a graph of the relationship between the current, voltage and temperature
FIG. 3 a schematic view of a measuring circuit
FIG. 4 a schematic view of power semiconductor stack
FIG. 5a a graph of a current ramp
FIG. 5b a graph of voltage measurements
FIG. 6 an example of data from an accelerated test
FIG. 7 a schematic flow diagram of an embodiment of the invention
Figure 2:
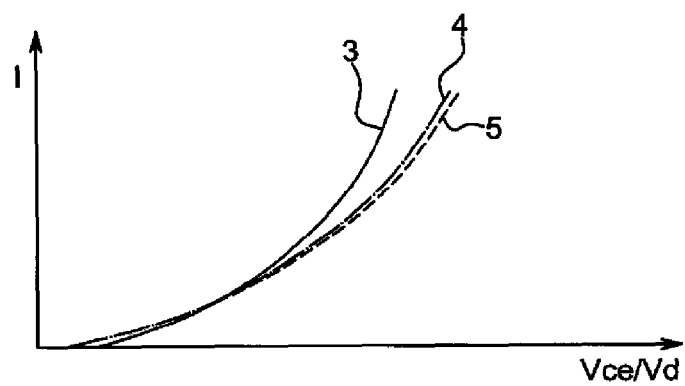

When current flows through the power device, such as a diode or an IGBT switch a voltage drop is generated across the component as shown in FIG. 1. The voltage drop can be divided into a voltage drop across a resistive part and voltage drop across the PN junction inside the semiconductor chips. Resistance lies in terminals, busbars, bonding wires, chip surface and in the silicon itself. Normally the PN junction has a negative temperature coefficient while the resistive part has a positive temperature coefficient, which leads to a voltage drop characteristic as shown in FIG. 2. Here can be seen an example of a relation between the current (I) and voltage drop. Vice is the voltage drop over a switch and Vd is the voltage drop over a diode. FIG. 2, graph 3 shows the relation when the power device is cold and the graph 4 shows a "warm" power device. This means that when the temperature rises, which occurs when the power device is activated, the relationship between the current and the voltage drop alter.

When a power device (switches and/or diodes) is used the internal resistance will increase due to wear. This can be due to solder cracks, surface cracking or bondwire liftoff. Thus, an increase of resistance will change the current/voltage behaviour; this is shown on FIG. 2. Graph 4 will change to the graph 5 when the power device is worn. In other words, the changes in voltage when the same current is applied at the same temperature indicate wear out of the power device.

This means that it is possible to estimate the end of lifetime and/or wearout of a power device when the current is determined as a function of the number of cycles of the power device, for a given temperature and current. A change (e.g. rise) in voltage indicate that the end of lifetime is approaching.

Figure 3:
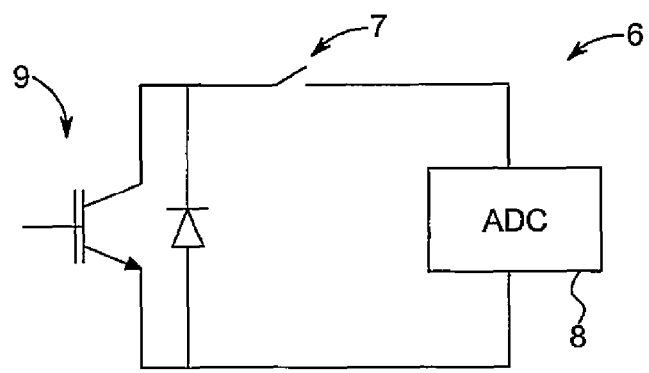

Detecting the change in voltage drop caused by the wearout of the power device can be challenging, because changes in the mV range must be detected while the power device is conducting compared to the voltage in the kV range that is across the power device when it is blocking. An example of a measuring circuit can be seen in FIG. 3. Here a measuring circuit 6 comprises a relay 7 which can block the high voltage across the test object 9 with a power device (such as IGBTs and/or diodes) and an Analog to Digital Converter (ADC) 8. The relay 7 can be mechanical and/or an electronic switch. When the test object 9 conducts, the relay 7 is closed so that the ADC 8 can detect the voltage drop across the power device. The relay 7 may be a mechanical relay or a semiconductor switch (e.g. MOSFET).

Figure 4:
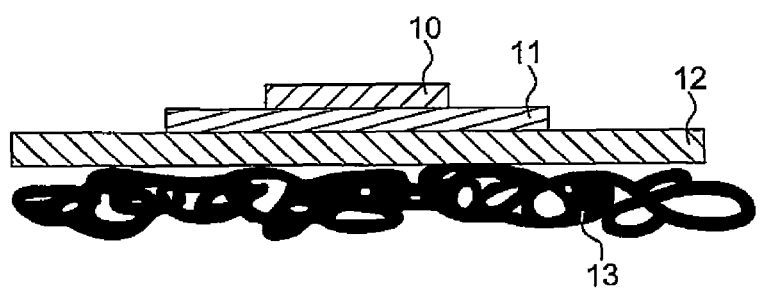

FIG. 4 shows a thermal stack, with a power chip 10, baseplate 12 of copper where between there is a ceramic layer 11 which isolates between the chip 10 and the baseplate 12. A power device can comprise one or more thermal stacks. The baseplate 12 is in contact with a liquid 13 that is part of a cooling circuit for the power device. If no loss has been generated in the chip 10 for some seconds, then the chip 10 temperature is equal (or very close to) the liquid 13 temperature. This means that the temperature can easily be determined e.g. via a temperature sensor that measures the liquid temperature. Hereafter the voltage can be determined by applying a current and measuring the voltage. As applying a current will heat the chip and lead to a temperature gradient over the stack, the most reliable data is obtained if the current is only applied for a very short time, such as maximum 100, 200, 300, 500, 1000 microsecond, or maximum 20%, 10% or 5% of the thermal time constant for the power chip.

Figure 5:
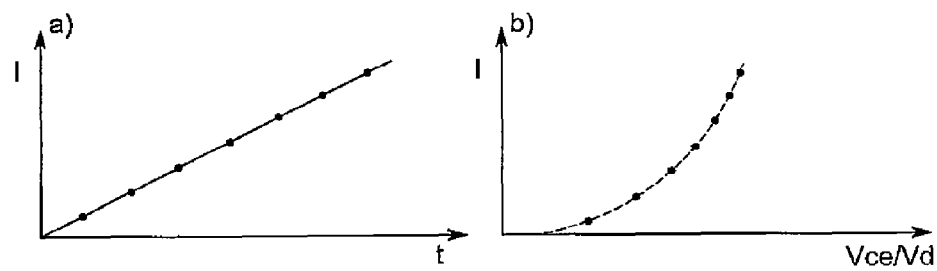

To improve the voltage measurement, a current ramp, as seen in FIG. 5 can be used. Here a plurality of increasing currents is applied and corresponding voltage is measured. In FIG. 5a the current (I) and time (t) current ramp can be seen where the dots are actual currents applied and the graph is a fitted line. The current ramp is applied for a very short time to keep temperature fluctuations at a minimum. In FIG. 5b the voltage (Vce/Vd) measurements can be seen for the applied currents (I) as dots. A line is fitted for the voltage and current relation giving better accuracy for the voltage determination for a given current. When having obtained the voltage measurements as a function of lifetime consumption, the increase in voltage is an indication of end of life time. However comparing with reference data e.g. obtained via accelerated tests and/or actual data from similar power devices and/or theoretical calculations can improve the precision of the estimated end of lifetime. A reference data set should describe the voltage over the switch as a function of current and temperature.

Accelerated tests can be performed by accelerating parameters, such as coolant temperature and current. More specifically, accelerated tests can be performed by running at higher mean temperature and larger temperature deflection than normal operation. This can be achieved by increasing one or more of the following parameters: Liquid coolant temperature, Current, DC-link voltage, Switching frequency or by reducing or increasing a fundamental frequency, (depending on operation as reduction yields larger temperature swing and increasing gives more cycles pr. time unit), or Change of angle between modulated voltage and current (changing the angle, one may shift loading from e.g. IGBT to diode, and thereby stressing IGBT or diode more than the other), or Change of modulation index (Increasing of modulation index will lead to a higher load of either IGBT or diode)

Figure 6:
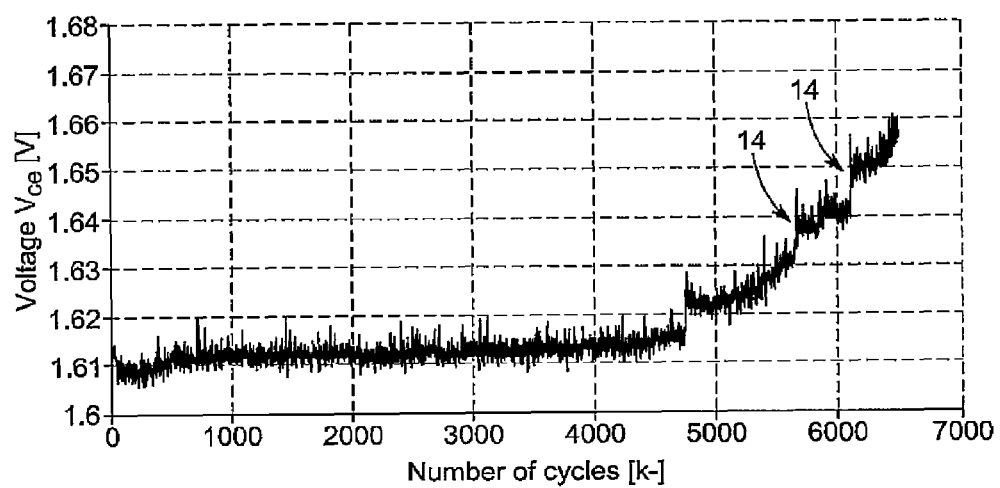

During the accelerated test, measuring sequences are introduced, similar to those described above to characterize the voltage drop across the power device. An example of an accelerated test can be seen in FIG. 6 where voltage for a certain current are plotted versus powercycles. As can be seen the voltage increases towards the end of life. Some discrete steps 14 are also seen, originated from bondwire liftoff. When determining the end of lifetime it is possible to use the number of bondwire liftoffs and/or a continuous increase in voltage as a measure of the end of wear out of the device.

Figure 7:
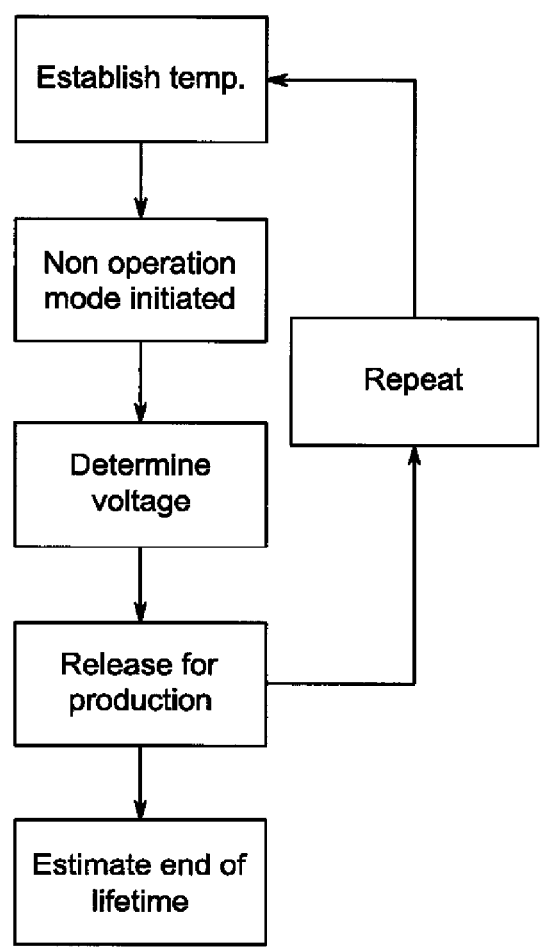

FIG. 7 shows a diagram for an embodiment of the invention. The method for estimation of the end of lifetime for a power semiconductor device initiates by establishing the temperature (establish temp.), this can be done as described above either by active liquid control, heating or cooling the cooling liquid, hereby controlling the liquid temperature or measure the temperature by other means, directly or indirectly. Afterwards it is secured that the power device is not in production (Non operation mode initiated) as this will secure that the chip temperature will equal the liquid temperature established in the previous step. Then the voltage drop over the power device is determined by applying a current (Determine voltage), the most reliable result is obtained when the current is applied for a short time so that the temperature of the power chip is not increased. Subsequently, the power semiconductor is then again released for production (Release for production). The determination of the voltage is then repeated at a later time, e.g. after the power device has performed additional operational cycles (Repeat). The plurality of determined voltages is connected to the number of cycles performed by the power device, and the estimation of the of lifetime is then established on the basis of changes in the voltage as a function of lifetime consumption (Estimate end of lifetime).

In a wind turbine application the voltage measurement circuitry can be used to detect wear out of the power modules. If the temperature of the chip and internal components of the power module is known, one can measure an increase of resistance in the circuit, as described above. Intervals where the wind turbine is not producing power can be used. In such a non operation situation, the chip temperature is very well linked to the cooling liquid temperature, as described above. These non operation intervals can be; service situations, when there is no wind, during lubrication sequence, cable unwinding, error on other components or a forced stop. During those non operation intervals the voltage measurement cycle may be executed. In a typical wind turbine application, the wind turbine control system controls the power converter by means of start/stop signals and reference signals, in addition to other signals. Depending on the configuration of the system, the liquid cooling system may be controlled by the power converter or by the Turbine Control system. Even though the cooling system may be controlled by the Wind Turbine Control system, there may still be a link to the power converter. This link may include measurements, safety signals etc.

An end of lifetime estimation/wearout detection sequence, can be built up as:
- Heat up the cooling liquid to a predefined temperature, e.g. 50° C. The heating can be done by a heating element or by running the converter itself. In case of a planned stop of the power converter, the Wind Turbine Controller may initiate the heating of liquid before actual stop of the converter
- The power production of the converter is stopped.
- Measure the voltage for a given current for each power semiconductor device that is monitored after stop of the power converter.
- Release the converter for power production.
- Compare the voltage measurements made with previous generated reference data and estimate end of lifetime/wearout of the power device.

The invention claimed is:

1. A method for estimating the end of lifetime for a power semiconductor device accommodated in a power converter comprising the steps of:
   establishing the temperature of the power semiconductor device,
   determining the voltage drop across the power semiconductor device during the flow of at least one predetermined current where said current is applied when the power semiconductor device is not in operation, repeating the step of determining the voltage drop a plurality of times thereby obtaining a plurality of determined voltage drops, and noting any change in said plurality of determined voltage drops;

wherein the end of lifetime is established dependent on the change in said plurality of determined voltage drops.

2. The method according to claim 1, wherein the end of lifetime is established by comparing the plurality of determined voltage drops with a reference data set of voltage drops.

3. The method according to claim 2, wherein the reference data set is established via accelerated tests.

4. The method according to claim 2, wherein the reference data set is a new updated reference data set.

5. The method according to claim 1, wherein estimated end of lifetime is used to change a derating factor for the power semiconductor device.

6. The method according to claim 1, wherein the temperature is established by determining the temperature of a power semiconductor chip comprised in the power semiconductor device.

7. The method according to claim 1, wherein the temperature is established by heating the power semiconductor device to a predetermined temperature.

8. The method according to claim 1, wherein the temperature is established when the power semiconductor device is not in operation.

9. The method according to claim 1, wherein the power semiconductor device has not been in operation for at least five times a thermal time constant of a thermal stack.

10. The method according to claim 1, wherein the current is applied for less time than 10% of a thermal time constant for a silicon chip comprised in the power semiconductor device.

11. The method according to claim 1, wherein the current is applied for less than 1 millisecond.

12. The method according to claim 1, wherein determining the voltage drop is established as a function of the lifetime consumption for the power semiconductor device.

13. An apparatus for estimating the end of lifetime for a power semiconductor device accommodated in a power converter comprising:

means for establishing the temperature of the power semiconductor device, means for determining the voltage drop over the power semiconductor device for at least one predetermined current where the current is applied when the power semiconductor device is not in operation, means for repeating the above steps a plurality of times thereby plurality obtaining a plurality of voltage drops, and means for establishing the end of lifetime based on the change of a plurality of determined voltage drops.

14. The apparatus of claim 13, wherein the means for establishing end of lifetime operates to compare the plurality of determined voltage drops with a reference data set of voltage drops.

15. The apparatus of claim 14, further comprising means for substituting the reference data set with a new updated reference data.

16. The apparatus of claim 13, wherein the apparatus further comprises at least one gate drive for the power semiconductor device, wherein the means to measure the voltage is integrated in the gate drive.

17. The apparatus of claim 13, wherein the means for establishing the temperature heats the power semiconductor device to a predetermined temperature.

18. A wind turbine comprising: a power semiconductor device and the apparatus of claim 13.

19. A wind turbine according to claim 18, comprising a liquid based system in thermodynamic contact with the power semiconductor device, wherein the liquid system comprises means for controlling the temperature of the liquid.

20. A wind turbine according to claim 19, comprising a wind turbine control system operationally connected to a power converter comprising the power semiconductor device and that the liquid system is in operationally connected to the power converter.

21. A wind turbine according to claim 20, wherein the wind turbine control system is operationally connected to the liquid system.

* * * * *